US008233283B2

(12) United States Patent
Mazzullo et al.

(10) Patent No.: US 8,233,283 B2
(45) Date of Patent: Jul. 31, 2012

(54) POWER SUPPLY DEVICE

(75) Inventors: Raymond Mazzullo, Constantia (ZA); Anthony Eric Bull, Wynberg (ZA)

(73) Assignee: Power Logic South Africa (Proprietary) Limited, Ottery (ZA)

( * ) Notice: Subject to any disclaimer, the term of this patent is extended or adjusted under 35 U.S.C. 154(b) by 274 days.

(21) Appl. No.: 12/740,812

(22) PCT Filed: Aug. 31, 2009

(86) PCT No.: PCT/IB2009/053782
§ 371 (c)(1), (2), (4) Date: Apr. 30, 2010

(87) PCT Pub. No.: WO2010/032144
PCT Pub. Date: Mar. 25, 2010

(65) Prior Publication Data

US 2010/0302755 A1 Dec. 2, 2010

(30) Foreign Application Priority Data

Sep. 22, 2008 (GB) .................................. 0817327.0

(51) Int. Cl.
*H05K 5/00* (2006.01)

(52) U.S. Cl. ......................... 361/730; 361/728; 361/715

(58) Field of Classification Search .................. 361/600, 361/679.01, 679.02, 679.4, 688–689, 690, 361/694, 695, 728–730, 752, 796, 800, 715; 174/66–67; 439/170–172, 625–626, 638, 439/733.1, 736, 744, 527, 535
See application file for complete search history.

(56) References Cited

U.S. PATENT DOCUMENTS

| | | | | |
|---|---|---|---|---|
| 5,122,069 | A * | 6/1992 | Brownlie et al. | 439/131 |
| 6,085,667 | A * | 7/2000 | Gevaert et al. | 108/50.02 |
| 6,589,073 | B2 * | 7/2003 | Lee | 439/535 |
| 7,075,784 | B2 * | 7/2006 | Sullivan | 361/679.47 |
| 7,621,764 | B2 * | 11/2009 | Shunjie | 439/131 |
| 2008/0121147 | A1 | 5/2008 | Cooke et al. | |
| 2009/0029576 | A1 | 1/2009 | Shunjie | |

FOREIGN PATENT DOCUMENTS

| | | |
|---|---|---|
| DE | 20014760 U1 | 12/2000 |
| WO | WO-2007134348 A1 | 11/2007 |

* cited by examiner

*Primary Examiner* — Hung S Bui
(74) *Attorney, Agent, or Firm* — Connolly Bove Lodge & Hutz LLP

(57) ABSTRACT

A power supply device (10) comprises a casing (26), a support structure (14) and driving means (42) for selectively rotating the casing (26) relative to the support structure (14). The casing (26) houses electrical equipment (36) and electrical sockets (30,32,34). The support structure (14) is attachable to the top (12) of an article of furniture and supports the casing (26) for rotation about an axis (28), parallel to the top (12). The casing (26) can be rotated by the driving means between an operative position in which the electrical sockets (30,32,34) face upwards and are accessible above the top (12), and a stowed position in which the electrical sockets (30,32,34) are not accessible from above the top (12). The casing (26) has a protuberance (40) that extends around the electrical sockets (30,32,34) and the protuberance (40) stands proud of the top (12) when the casing (26) is in its operative position.

20 Claims, 3 Drawing Sheets

POWER SUPPLY DEVICE

CROSS REFERENCE TO RELATED APPLICATIONS

This application is a National Phase filing under 35 U.S.C. §371 of PCT/IB2009/053782 filed on Aug. 31, 2009; and this application claims priority to Application No. 0817327.0 filed in Great Britain on Sep. 22, 2008 under 35 U.S.C. §119; the entire contents of all are hereby incorporated by reference.

FIELD OF THE INVENTION

This invention relates to power supply systems. In particular, the invention relates to a power supply device for attachment to the top of an article of furniture.

BACKGROUND TO THE INVENTION

Power supply systems are known in which electrical components such as power sockets, communication sockets, and/or the like, are selectively made accessible on the tops of furniture such as tables and benches, with power supply and/or other cables leading from the electrical components underneath the table or desk top. These power supply systems are often configured to allow them to be stowed or covered conveniently and to be accessed when needed.

A number of these power supply systems have been developed in which an assembly that houses electrical and/or communication sockets, is fitted in a table/bench top and is rotated between an operable position in which the sockets are accessible from above and a stowed position in which the sockets are below the table/bench top and in which an upwardly facing part of the assembly is generally flush with the table bench top.

One of the potential risks of an assembly of this type is the possible ingress of liquids into the assembly when in its operable position. The sockets are either flush with the table/bench top or are recessed below it and if a liquid is spilt on the table/bench top, it can flow into the sockets quite easily, causing short circuits and/or damage to electrical equipment, safety hazards and the like.

Another potential risk of such a rotating table/bench top assembly is that it may be rotated towards its stowed position, with electrical equipment on top of the table/bench still connected to the sockets, resulting in damage to conductors extending to the sockets, which in turn causes short circuits, damage to electrical equipment, safety hazards, and the like. Similar problems can occur if other objects are damaged by rotation of the assembly, e.g. if an electrical conductor of equipment that is not in use, is damaged, which would cause safety hazards or the like later, when that conductor is used. An attempt has been made to address this risk by providing an optical sensor that senses the presence of connectors in the sockets and by preventing rotation of the assembly while the presence of connectors is sensed in the sockets. However, even if optical sensors could detect each type of connector that could be connected to such a socket (which could require multiple, complicated and/or expensive sensors), the potential risk of other objects obstructing rotation of the assembly, would still not be addressed.

The present invention seeks to provide a power supply system in which these potential risks are minimised.

SUMMARY OF THE INVENTION

According to the present invention there is provided a power supply device comprising:

a casing housing electrical equipment and defining at least one electrical socket;

a support structure, configured for attachment to the top of an article of furniture and for supporting the casing for rotation about an axis extending generally parallel to the top, between an operative position in which the electrical sockets face upwardly and are accessible above the top, and a stowed position in which the electrical sockets are not accessible from above the top; and driving means for selectively rotating the casing relative to the support structure, between its operative and stowed positions;

wherein the casing includes a protuberance extending around the electrical sockets and said protuberance and support structure being configured such that the protuberance stands proud of the top when the casing is in its operative position.

The sockets may be defined in the protuberance and may include sockets for supplying electrical power and/or communication sockets such as telephone or data sockets. The sockets for supplying electrical power may be defined in the casing and the communication sockets may be defined adjacent the casing.

The power supply device may further include a control system for controlling rotation of the casing by the driving means, the control system including a torque sensor that is configured to measure the torque applied by the driving means to rotate the casing and being configured to reverse the direction of rotation if the torque exceeds a predetermined value. If the torque exceeds the predetermined value again after the reversal, the rotation may be stopped, but preferably, the direction of rotation is reversed a number of times before rotation is stopped.

BRIEF DESCRIPTION OF THE DRAWINGS

For a better understanding of the present invention, and to show how the same may be carried into effect, the invention will now be described by way of non-limiting example, with reference to the accompanying drawings in which.

DETAILED DESCRIPTION OF THE DRAWINGS

Figure 1:
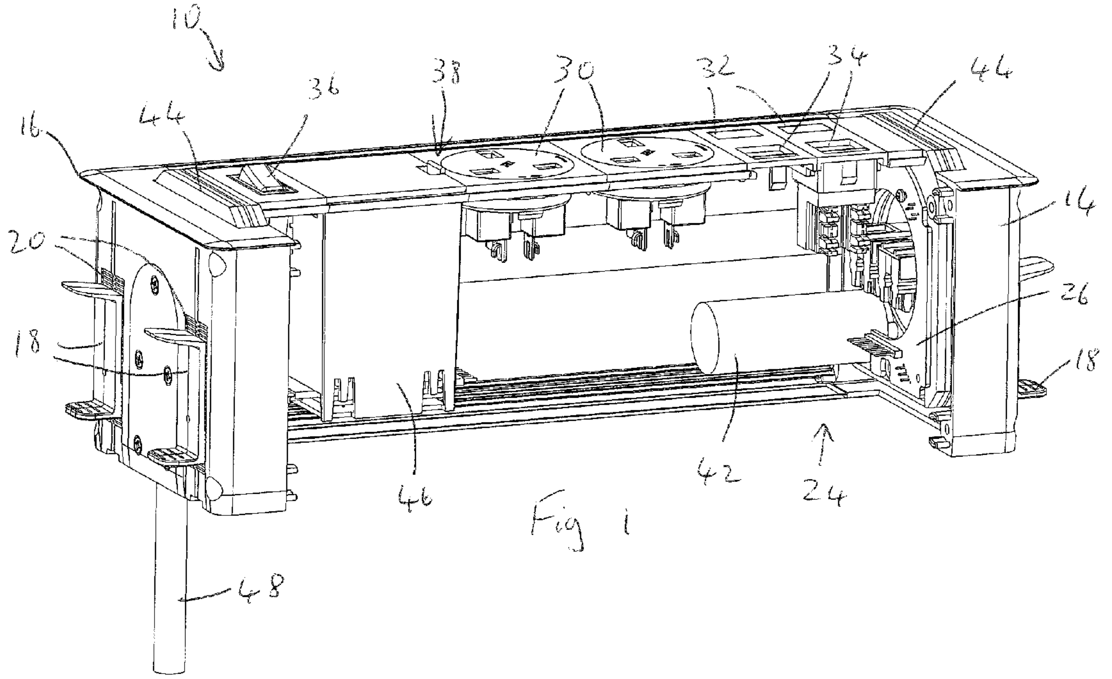
FIG. 1 is a part-sectional, three dimensional view of a first embodiment of a power supply device in accordance with the present invention.
Figure 2:
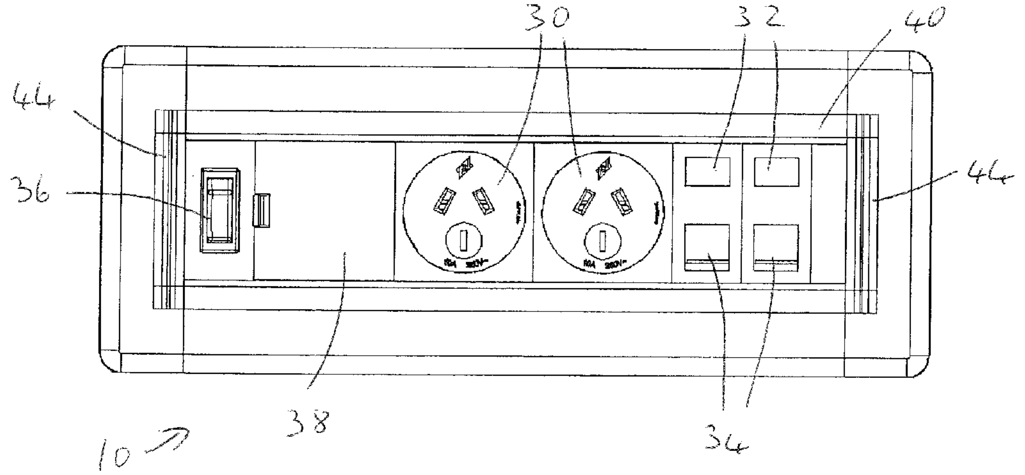
FIG. 2 is a top plan view of the power supply device of FIG. 1.

Referring to the drawings, a power supply device in accordance with the present invention is generally indicated by reference numeral 10.

As shown in FIGS. 3 and 4A to 4C, the device 10 is intended to be installed in the top 12 of an article of furniture such as a table, bench, desk, etc.

The device 10 includes a support structure in the form of an outer casing 14 that can be attached to the top 12 by way of an upper lip 16 of the outer casing that can rest on an upper surface of the top 12 and sliding brackets 18 that grip the underside of the top 12, while held in position with a ratchet mechanism 20. The outer casing 14 has a generally rectangular, elongate shape and defines a rectangular upper opening 22, generally flush with the upper surface of the top 12 and a lower opening 24.

The device 10 further includes an inner casing 26 that is also elongate and has a generally square cross-sectional profile, bevelled at its corners. The inner casing 26 is disposed inside the outer casing 14 in a rotating manner, allowing it to rotate about a rotational axis 28, which extends along the length of the inner casing and thus longitudinally relative to the device 10 and generally parallel to the top 12.

The inner casing 26 houses a combination of electrical equipment, which in the illustrated example includes two electrical power sockets 30, a power switch 36, and four communication sockets including two telephone sockets 32 and two data sockets 34. However, in other embodiments of the invention, any number or type of electrical equipment can be housed in the inner casing 26. The switch 36 and sockets 30,32,34 are housed in a face 38 of the inner casing 26, that faces upwards in FIGS. 1 to 3 and 4C and that faces to the left in FIG. 4A.

Figure 3:
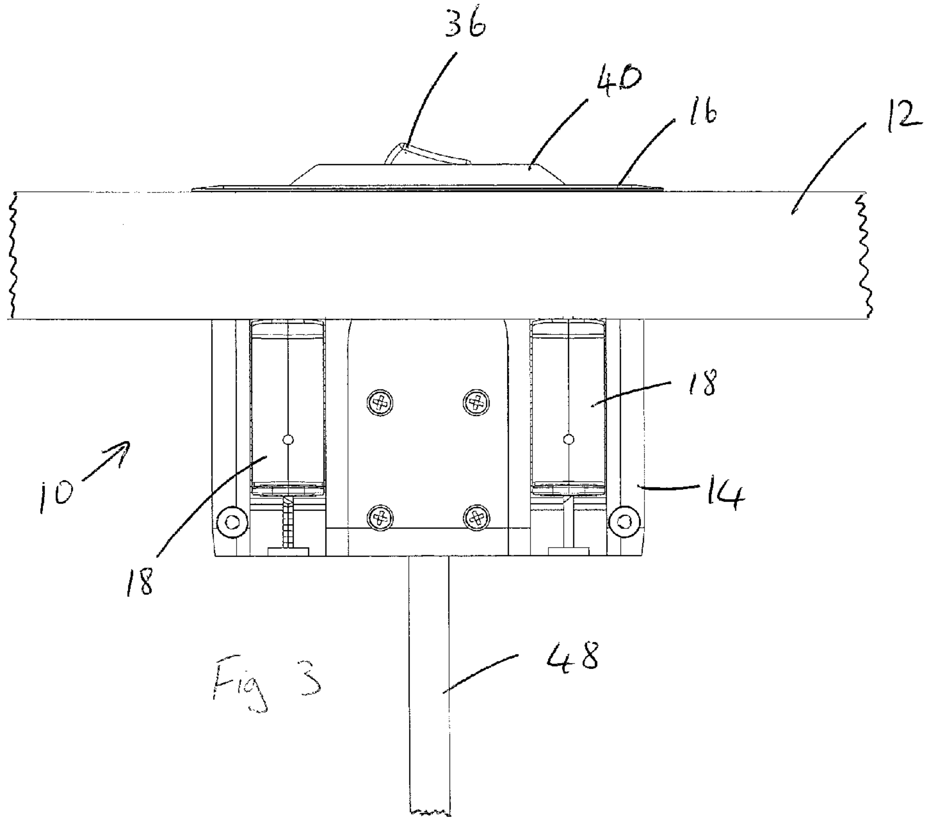
FIG. 3 is a pictorial end view of the power supply device of FIG. 1, installed in the top of an article of furniture.
Figure 4A:
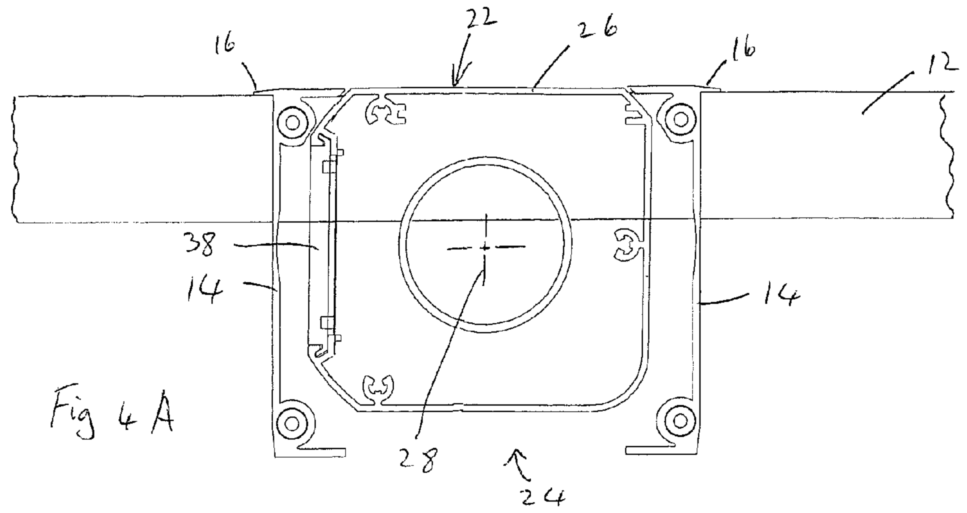
FIGS. 4A to 4C show schematic end views of parts of a casing and support structure of the power supply device of FIG. 1, installed in the table top as shown in FIG. 3, while rotating from the stowed position of the casing, to its operative position.
Figure 4B:
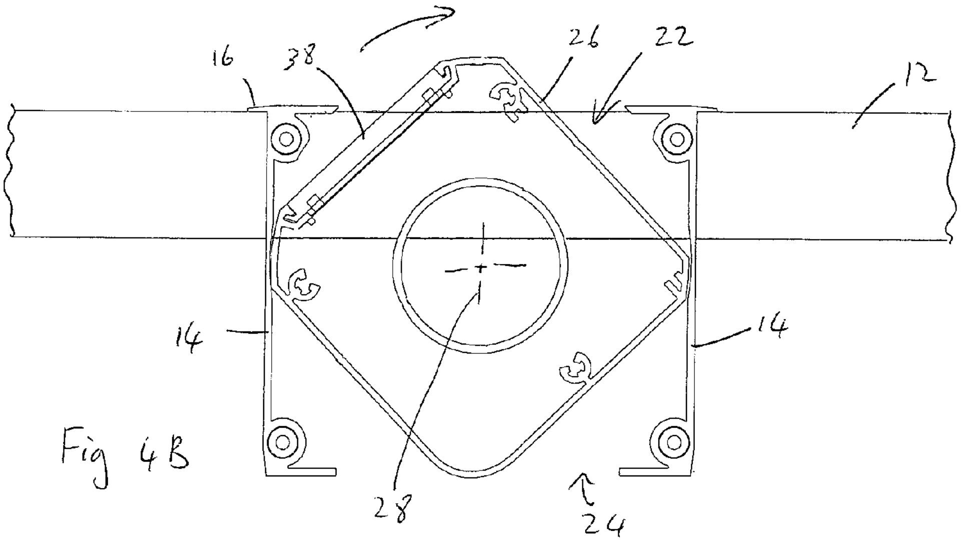
Figure 4C:
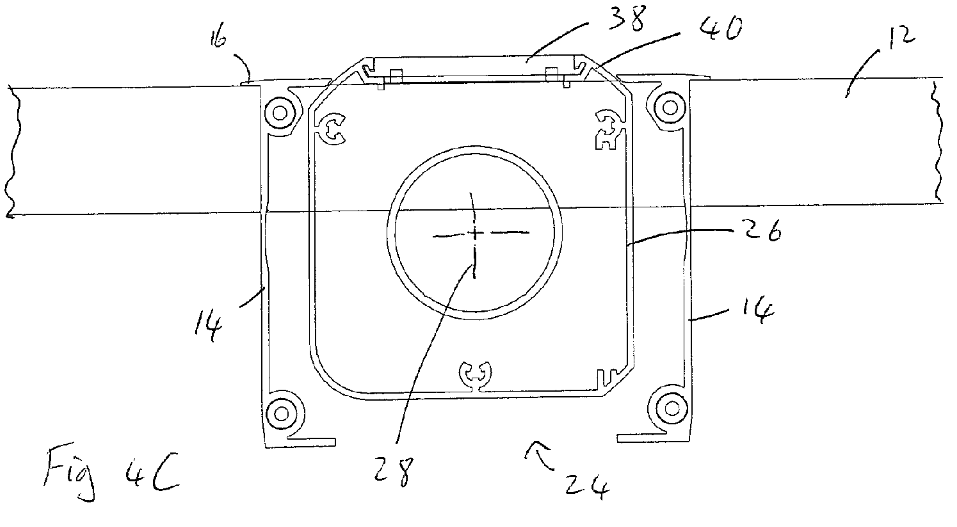

The inner casing 26 can be rotated relative to its axis 28 between an operative position as shown in FIGS. 1 to 3 and 4C and a stowed position as shown in FIG. 4C. In the operative position, the face 38, switch 36 and sockets 30,32,34 face upwards and are accessible from above the top 12, whereas in the stowed position, the face, switch and sockets face to the left, inside the outer casing 14, partly underneath the top, so that they are not accessible from above the top.

As can best be seen in FIGS. 1, 3 and 4C, the inner casing 26 protrudes a little further in the direction of the face 38, than in the other directions, so that it defines a protuberance 40 that extends around the face, so that the face forms the uppermost part of the protuberance when the inner casing 26 is in its operative position. The protuberance 40 causes the face 38 to be raised above the upper surface of the top 12. This has a very important advantage in that liquids on the top 12 (e.g. spilt beverages) that flow on the top and that reach the device 10 generally either remain on the upper surface of the top and are prevented from reaching the elevated face 38 and its electrical equipment that stands proud of the top, or the liquids drain through the upper and lower openings 22,24, around the inner casing 26. Accordingly, the elevated position of the face 38 in the protuberance 40 above the top 12 reduces the risk that liquids will reach the electrical equipment 30,32,34,36, where the liquids could be exposed to electricity and cause damage, short circuits, safety hazards, etc.

The device 10 also includes driving means in the form of a geared electrical motor 42 that is housed inside the inner casing 26 and that is configured to rotate the casing 26 about its axis 28 between its operative and stowed positions. Two switches in the form of touch strips 44 with internal LEDs, are provided at the ends of the inner casing 26, for activating the driving means to rotate the inner casing between its operative and stowed positions. Further, the device 10 includes a control system, most of the circuitry of which is housed in a compartment 46 with a removable lid in the face 38 through which it can be accessed for maintenance purposes.

In addition to the circuitry in the compartment 46, the control system can also include a torque sensor, sensing the torque applied by the motor 42 when rotating the inner casing, or it can include means for sensing the current required by the motor 42. Further, the control system includes a position sensor (not shown) in the form of an optical pick-up on one of the ends of the inner casing 26, that reads indexing marks provided on the inside of the outer casing 14.

The operation of the device, is best illustrated by the sequential views in FIGS. 4A to 4C.

When the device 10 is not required, it is kept in its stowed position as shown in FIG. 4A, in which one of the sides of the inner casing, other than the face 38, faces upwardly, aligned with the lip 16 of the outer casing and generally flush with the upper surface of the top 12. The flush alignment of the device 10 with the upper surface of the top 12 minimises the likelihood that the device will obstruct normal use of the top 12 and/or that the device will receive an impact when articles are moved around on the top 12, in addition to being aesthetically pleasing.

When the device 10 is needed, e.g. when electrical power from the sockets 30 is required above the top 12, or equipment needs to be connected to the communication sockets 32,34, either of the touch strips 44 is touched to activate the control system, which controls the motor 42 to rotate the inner casing 26 clockwise as shown in FIG. 4B, until it reaches its operative position as shown in FIG. 4C, at which time the position sensor provides feedback to the control system and power to the motor 42 is discontinued.

While the inner casing 26 is in its operative condition, the sockets 30,32,34 can be used. The switch 36 is used to switch power supply to the power sockets 30 on and off. It may be mentioned that power for the sockets 30 and also for driving the control system and the motor 42 are provided via a cable 48 that enters the device 10 at one end of the outer casing 14 and that extends inside the inner casing 26 to the relevant components, in the form of suitable conductors (not shown). Likewise, the sockets 32,34 are connected via suitable conductors inside the inner casing 26 to external female sockets on the end of the outer casing 14 opposite from the cable 48 and these female sockets can receive standard male telephone or computer connectors.

If the device 10 is no longer required, any conductors or other equipment that may be connected to the sockets 32,34, are removed and one of the touch strips 44 is touched to activate the control system, which causes the motor 42 to rotate the inner casing 26 anti-clockwise from its operative position to its stowed position, in an exact reversal of the rotation described with reference to FIGS. 4A to 4C.

In the event that any of the equipment connected to the sockets 30,32,34 is not removed before the inner casing is rotated from its operative position to its stowed position, or if rotation of the inner casing in either direction is obstructed, e.g. by an object becoming jammed between the inner and outer casings, the relevant equipment or object will cause interference to the rotation and the torque required by the motor 42 to rotate the inner casing will increase. The increase in torque is either sensed directly by the control system, or is sensed in an increase in electrical current to the motor 42 and if the torque exceeds a predetermined quantity, the control system immediately reverses the rotational direction of the motor and the inner casing. In the event that rotation in the opposite direction is also hindered, the torque will increase again and the control system will again reverse the rotational direction. This reversal of the rotational direction can be repeated for a predetermined number of repetitions, which effectively results in an oscillation of the inner casing and the oscillation can cause an obstructing object to become dislodged, to allow the rotation of the inner casing in either direction to be completed. However, if the motor torque remains high after a set number of oscillations, the control system enters an error state and stops the motor.

The control system is also configured to provide feedback to a user, by way of colours of the LEDs emitted through the touch strips 44. In particular, the LEDs can be used to show when the device 10 is ready to be used, when the inner casing 26 is in its stowed position, when the inner casing is busy rotating, and when the control system is in an error state. To clear the error state of the control system, the touch strips 44 can be touched continuously for a predetermined period of time or as a final resort, the electrical power supply to the device can be interrupted. The preferred method of clearing the error state would depend on the severity of the fault causing the error state.

Figure 5:
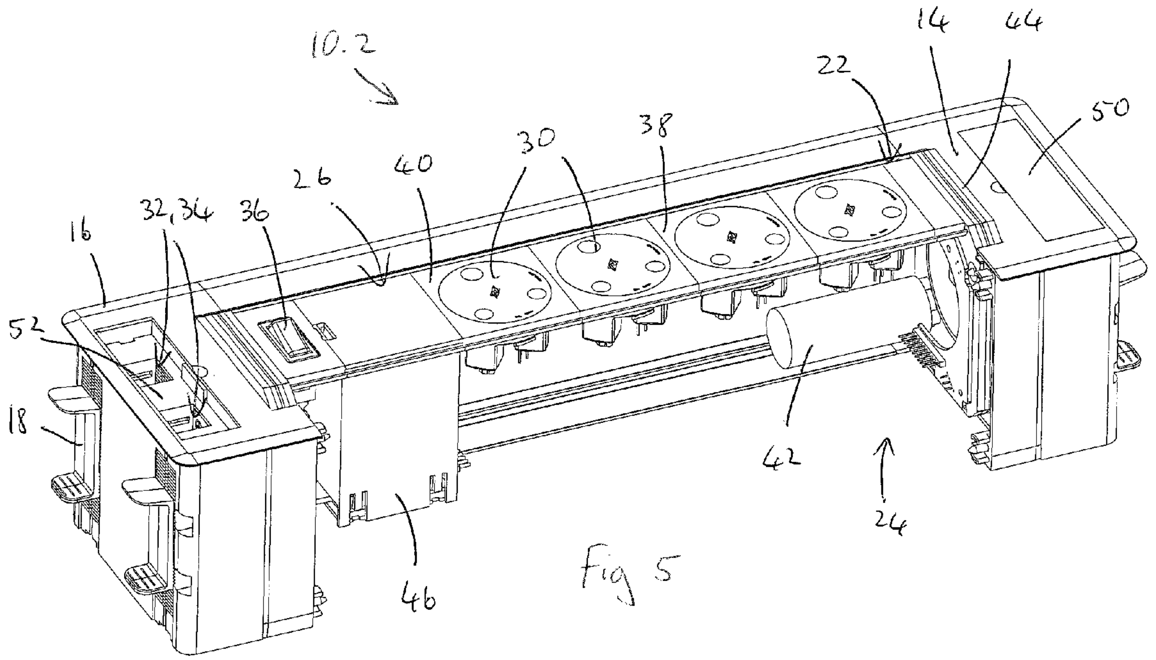
FIG. 5 is a part-sectional, three dimensional view of a second embodiment of a power supply device in accordance with the present invention.

Referring to FIG. 5, in a second embodiment of the invention, the device (identified by reference numeral 10.2) includes an outer casing 14 with a lip 16, ratcheted brackets 18, upper opening 22, lower opening 24, inner casing 26, power sockets 30, power switch 36, face 38, protuberance 40, motor 42, touch strips 44 and compartment 46, generally the same as their counterparts shown in FIGS. 1 to 4.

The device 10.2 differs from the device 10 of FIGS. 1 to 4 in that it does not have data and telephone sockets defined in the inner casing 26, but instead has data/telephone sockets 32,34 defined in the outer casing 14, adjacent the ends of the inner casing. The sockets 32,34 can be covered by a cover plate 50 that can pivot to allow access to the sockets and that can be slid underneath the face of the outer casing 14, to keep it out of the way and prevent it from being damaged.

The sockets 32,34 are standard sockets that are connected to conventional communications and/or telephone cables that extend downwards in the casing 14, below the sockets and extends out of the underside of the casing. As a result, when the device 10.2 is installed, a conventional cable and socket can easily be installed to extend into the underside of the casing and the conventional socket can be installed in a face plate 52, to form a socket 32,34 of the device 10.2.

With the sockets 32,34 installed in the outer casing 14, they obviously do not rotate with the inner casing 26. This has an advantage in that the conductors for telephone/data cables are typically very thin, compared to conductors for power sockets. Accordingly, it is sometimes preferable that bending of electrical/data cables is limited, whereas power cables can typically endure many times more bending cycles. In the device 10.2, the power conductors supplying electrical power to the power sockets are subjected to mild bending every time the casing 26 is rotated. (The bending is minimal due to sufficient slack in the conductors.) At the same time, the telephone/data conductors for the sockets 32,34 remain stationary and are not subjected to bending cycles.

The device 10.2 is further useful for installing in tops of furniture or the like, where access to the ends of the outer casing is restricted, e.g. if the top 12 in which the device is being installed, is too thick. In the device 10.2, all the cables enter the device from underneath, unlike the telephone and data cables that are connected to sockets on the ends of the device 10 of FIGS. 1 to 4.

The invention claimed is:

1. A power supply device comprising:

a casing housing electrical equipment and defining at least one electrical socket;

a support structure, configured for attachment to the top of an article of furniture and for supporting the casing for rotation about an axis extending generally parallel to the top, between an operative position in which the electrical sockets face upwardly and are accessible above the top, and a stowed position in which the electrical sockets are not accessible from above the top; and driving means for selectively rotating the casing relative to the support structure, between its operative and stowed positions;

characterised in that the casing includes a protuberance extending around the electrical sockets and said protuberance and support structure being configured such that the protuberance stands proud of the top when the casing is in its operative position.

2. A power supply device as claimed in claim 1, characterised in that the sockets are defined in the protuberance.

3. A power supply device as claimed in claim 2, characterised in that said device includes sockets for supplying electrical power and communication sockets.

4. A power supply device as claimed in claim 3, characterised in that said device includes sockets for supplying electrical power that are defined in the casing and communication sockets that are defined adjacent the casing.

5. A power supply device as claimed in claim 3, characterised in that said device includes a control system for controlling rotation of the casing by the driving means, the control system including a torque sensor that is configured to measure the torque applied by the driving means to rotate the casing and being configured to reverse the direction of rotation if the torque exceeds a predetermined value.

6. A power supply device as claimed in claim 5, characterised in that said device is configured to stop the rotation if the torque exceeds the predetermined value again after the reversal.

7. A power supply device as claimed in claim 5, characterised in that said device is configured to reverse the direction of rotation a number of times before rotation is stopped.

8. A power supply device as claimed in claim 2, characterised in that said device includes a control system for controlling rotation of the casing by the driving means, the control system including a torque sensor that is configured to measure the torque applied by the driving means to rotate the casing and being configured to reverse the direction of rotation if the torque exceeds a predetermined value.

9. A power supply device as claimed in claim 8, characterised in that said device is configured to stop the rotation if the torque exceeds the predetermined value again after the reversal.

10. A power supply device as claimed in claim 8, characterised in that said device is configured to reverse the direction of rotation a number of times before rotation is stopped.

11. A power supply device as claimed in claim 1, characterised in that said device includes sockets for supplying electrical power and communication sockets.

12. A power supply device as claimed in claim 11, characterised in that said device includes sockets for supplying electrical power that are defined in the casing and communication sockets that are defined adjacent the casing.

13. A power supply device as claimed in claim 12, characterised in that said device includes a control system for controlling rotation of the casing by the driving means, the control system including a torque sensor that is configured to measure the torque applied by the driving means to rotate the casing and being configured to reverse the direction of rotation if the torque exceeds a predetermined value.

14. A power supply device as claimed in claim 13, characterised in that said device is configured to stop the rotation if the torque exceeds the predetermined value again after the reversal.

15. A power supply device as claimed in claim 11, characterised in that said device includes a control system for controlling rotation of the casing by the driving means, the control system including a torque sensor that is configured to measure the torque applied by the driving means to rotate the casing and being configured to reverse the direction of rotation if the torque exceeds a predetermined value.

16. A power supply device as claimed in claim 15, characterised in that said device is configured to stop the rotation if the torque exceeds the predetermined value again after the reversal.

17. A power supply device as claimed in claim 15, characterised in that said device is configured to reverse the direction of rotation a number of times before rotation is stopped.

18. A power supply device as claimed in claim 1, characterised in that said device includes a control system for controlling rotation of the casing by the driving means the control system including a torque sensor that is configured to measure the torque applied by the driving means to rotate the casing and being configured to reverse the direction of rotation if the torque exceeds a predetermined value.

19. A power supply device as claimed in claim 18, characterised in that said device is configured to stop the rotation if the torque exceeds the predetermined value again after the reversal.

20. A power supply device as claimed in claim 18, characterised in that said device is configured to reverse the direction of rotation a number of times before rotation is stopped.

* * * * *